United States Patent

Kappel et al.

Patent Number: 6,148,842
Date of Patent: Nov. 21, 2000

[54] COMPENSATION ELEMENT FOR THE COMPENSATION OF TEMPERATURE-CONDITIONED LENGTH CHANGES OF AN OBJECT

[75] Inventors: Andreas Kappel; Randolf Mock, both of Munich; Hans Meixner, Haar, all of Germany

[73] Assignee: Siemens Aktiengesellschaft, Munich, Germany

[21] Appl. No.: 09/108,669

[22] Filed: Jul. 1, 1998

[30] Foreign Application Priority Data

Jul. 1, 1997 [DE] Germany ............................ 197 27 992

[51] Int. Cl.[7] .................................................. F16K 17/38
[52] U.S. Cl. ....................... 137/79; 137/78.1; 251/125.06
[58] Field of Search ............................ 137/468, 79, 78.1; 251/129.06

[56] References Cited

U.S. PATENT DOCUMENTS

| | | | |
|---|---|---|---|
| 1,702,186 | 2/1929 | Wilson | 137/468 |
| 1,992,789 | 2/1935 | Veale | 137/468 |
| 3,949,849 | 4/1976 | Hammer | 192/58 B |
| 4,535,914 | 8/1985 | Coty | 222/52 |
| 4,550,744 | 11/1985 | Igashira et al. | 137/80 |
| 4,725,002 | 2/1988 | Trachte | 239/102.2 |
| 4,732,216 | 3/1988 | Polan | 169/38 |
| 4,995,587 | 2/1991 | Alexius . | |
| 5,207,737 | 5/1993 | Hanley et al. | 137/85 |
| 5,318,268 | 6/1994 | Cox et al. | 251/11 |
| 5,780,958 | 7/1998 | Sturgach et al. | 310/348 |
| 5,810,255 | 9/1998 | Itoh et al. | 251/129.06 |
| 5,988,210 | 11/1999 | Komiya et al. | 137/487.5 |

FOREIGN PATENT DOCUMENTS

| | | |
|---|---|---|
| 35 33 085 A1 | 3/1987 | Germany . |
| 195 19 191 A1 | 12/1996 | Germany . |
| 195 40 155 A1 | 4/1997 | Germany . |
| 2 094 940 | 10/1981 | United Kingdom .............. 251/129.06 |
| 2 112 907 | 7/1983 | United Kingdom .................... 137/468 |

*Primary Examiner*—Denise L. Ferensic
*Assistant Examiner*—Ken B. Rinehart
*Attorney, Agent, or Firm*—Hill & Simpson

[57] ABSTRACT

The compensation element is compensating for temperature-conditioned length changes of an object. An injection valve that is fully functional in the entire range of the operating temperatures of a motor requires a device that compensates thermally conditioned length changes of the mechanical components (piezo-electric actuator, valve lifter, housing, etc.). This device should be capable of absorbing great forces and allow a stiff bearing of the actuator. The compensation element (3) has an oil-filled chamber (21) is composed of an actuator-side upper part (18), of a lower part (19) supported on a stiff bearing (valve housing 17), and of a structure (annular seal element 20) sealing the chamber (21) and yielding in an axial direction. Since the compensation element (3) is fitted into an annular holder (4) with little lateral play, every temperature-conditioned change of the oil or, respectively, chamber volume results in a displacement of the upper housing part (18) in an axial direction that is proportional to the volume change. As a result of a corresponding dimensioning of the chamber height, temperature-conditioned length changes of the valve housing (4) and of the piezo-electric actuator (2) can be compensated using the extremely compactly constructed and comparatively rigid compensation element (3).

17 Claims, 5 Drawing Sheets

COMPENSATION ELEMENT FOR THE COMPENSATION OF TEMPERATURE-CONDITIONED LENGTH CHANGES OF AN OBJECT

BACKGROUND OF THE INVENTION

Due to good dynamic properties and comparatively compact structure, piezo-electric actuators are being more frequently utilized as drives in modern gasoline and diesel injection systems. Currently under development, in particular, are what are referred to as directly driven valve systems wherein the piezo-electric actuator acts directly without interposition of a stroke transformer or indirectly on a valve needle or a valve lifter, whereby the needle or, respectively, lifter stroke thus approximately corresponds to the adjustment path generated by the actuator. Independently of the respective operating temperature of the motor, the valve systems must meet the strictest demands with respect to the dosing precision and the reproducibility of the injected fuel quantity. An injection valve that is fully functional and works with a high electro-mechanically efficiency in the temperature range=–40° C. to 140° C. therefore requires elements for the compensation of thermally conditioned length changes of the piezo-electric actuator, of the other mechanical components (valve lifter, valve needle, etc.) and of the housing.

Great Britain reference 2,228,769 A, U.S. Pat. No. 4,995,587 and European reference 0,218,895 B1 disclose injection, dosing or control valves directly driven or equipped with a stroke transformer.

For the compensation of temperature-conditioned length changes of the piezo-electric actuator, Great Britain reference 2,228,769 A proposes that a metal cylinder of a suitable length be arranged between the actuator and the valve lifter.

The element compensating temperature-conditioned length changes of the injection valve disclosed by U.S. Pat. No. 4,995,587 is essentially composed of a pot-shaped part that is screwed to the valve housing and closed at the actuator side and of a piston displaceably arranged in the pot-shaped part. The spring-loaded piston is screwed to a supporting plate lying against the actuator and face. An elastomer serves as a filler for the compensation chamber formed by the piston and the pot-shaped part.

The piezo-electric actuator of the injection valve disclosed by European reference 0,218,895 B1 is supported on a damping piston guided play-matched in a housing bore. The damping piston and the housing bore form a fluid-filled chamber that is in communication with a compensation volume via an annular gap present between the damping piston and the housing bore.

In the known valves, the bearing of the piezo-electric actuator has not been satisfactorily resolved, this having a disadvantage effect on the electro-mechanical efficiency of the drives. Moreover, the stiffness of the respective bearings which is highly reduced due to the compensation elements forces an employment of over-long piezo-electric actuators in order to compensate for the losses of actuating path and actuating force produced by expansion of the mechanical components.

SUMMARY OF THE INVENTION

It is an object of the present invention to provide a compensation element for the compensation of temperature-conditioned length changes of an object, particularly of an electromechanical transducer (piezo-electric, electrostrictive or magnetostrictive actuator). The compensation element should exhibit low structural height, be able to absorb great static and dynamic forces, compensate for tiltings and also enable a rigid bearing of the object.

The simply constructed compensation element that is cost-beneficial to manufacture and completely maintenance-free compensates for temperature-conditioned length changes in an extremely dependable way even under extreme conditions. Due to the comparatively great stiffness of the compensation element, the electro-mechanical transducer supported thereon in a correspondingly modified injection, dosing or control valve works with a noticeably higher mechanical efficiency than the actuators of the prior art valves. Moreover, the compensation element sees to an optimum frictional connection since the transducer, despite a manufacture-conditioned non-parallelism of its two end faces, always lies surface-wide against the allocated actuating element (lift piston/valve lifter or, respectively, diaphragm/valve lifter, etc.).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
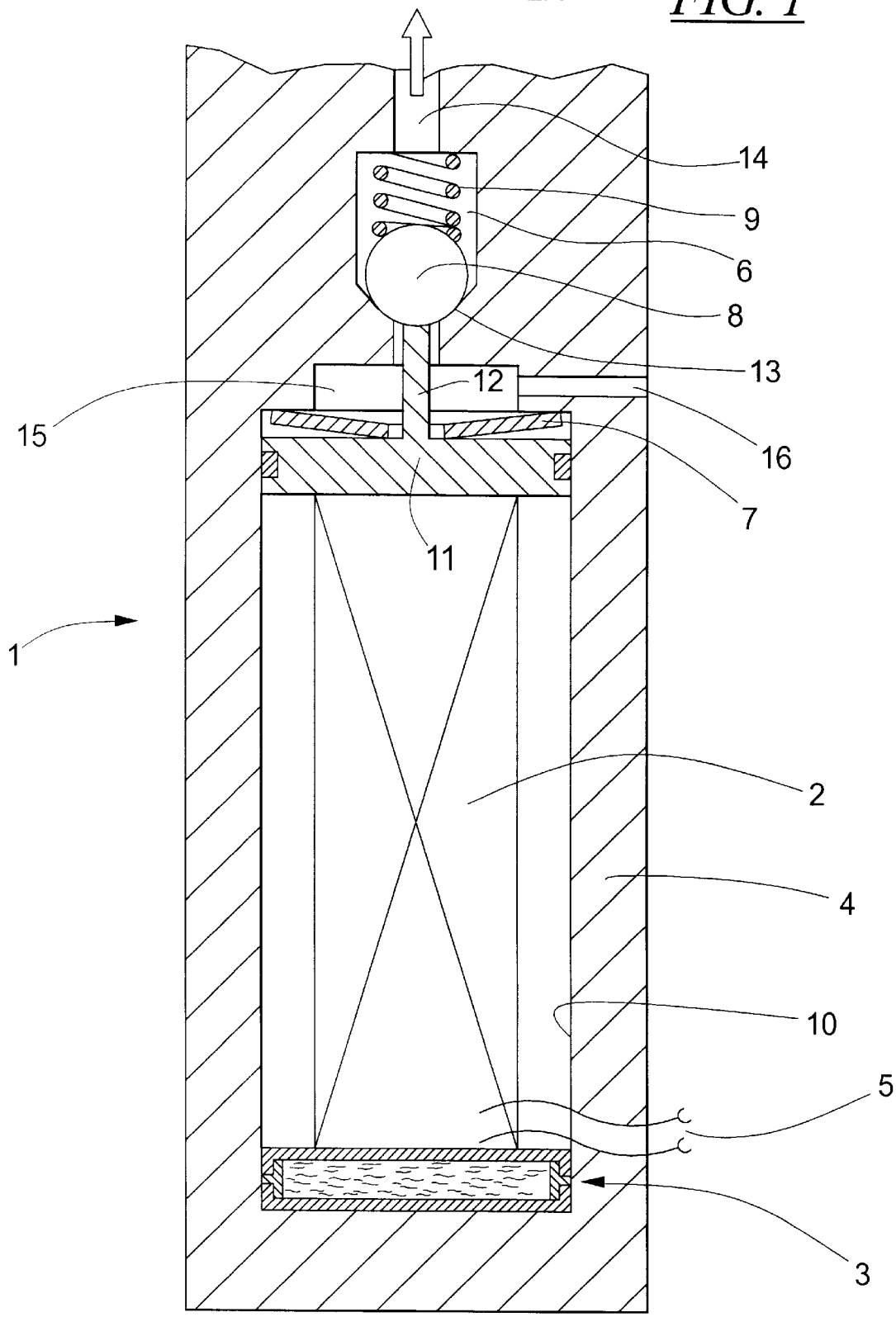
FIG. 1 is a cross-section through a control shutoff valve modified in conformity with the invention.

FIG. 1 shows an inventively modified, outwardly opened valve 1 for the shut-off of the injection pressure built up in the working chamber of a diesel common rail injector. As a drive, the shut-off valve contains a piezo-electric actuator 2 that is supported at a compensation element 3 compensating temperature-conditioned length changes and that is supplied with the required operating voltages via leads 5 conducted out of the valve housing 4. A piezo-electric multi-layer stack is particularly suited as the valve drive since this actuator type, in addition to generating the required actuating force of F≈$10^2$–$10^5$ N, also generates what is still a comparatively great primary stroke at moderate operating voltages (relative length change of the actuator cone $\Delta l/l \approx 10^{-3}$; l:actuator length). In order to be able to suddenly drop the injection pressure of, typically, p≈2000 bar built up in the working chamber (not shown) of the injector and also prevailing in the fuel-filled spring chamber 6 of the shut-off valve 1, the piezo-electric actuator 2 is charged within a time span of T≦100 $\mu$s and is thereby elongated in the axial direction. As soon as the actuating force of the actuator 2 exceeds the opposing forces generated by the saucer spring 7, the closing spring 9 acting on the valve ball 8 and the fuel pressure, the piston 11 guided in the cylindrical housing bore 10 as well as the valve lifter 12 rigidly connected to the piston 11 with the installed O-ring seal moves upward by a distance corresponding to the actuator stroke $\Delta l$. In response thereto, the lifter 12 lifts the valve ball 8 from its sealing seat 13, so that the fuel can flow unimpeded from the working chamber of the injector via the intake 14 and the spring chamber 6 into the shut-off chamber 15 and can flow off from the latter via the housing bore 16.

The piezo-electric actuator 2 is discharged in order to suppress the flow-off of the fuel. As a consequence of the contraction of the piezo-electric sintered body involved therewith, the O-ring sealed piston 11 and the valve lifter 12 move downward into their initial position compelled by the restoring force exerted by the strong saucer spring 7, whereby the closing spring 9 again seats the valve ball 8 at the sealing seat 13. After the intake 14 has been separated from the outlet 16, the fuel pressure in the spring chamber 6 of the shut-off valve 1 rises again to the preceding value of approximately p≈2000 bar.

It is not difficult to see with reference to FIG. 1 that the shut-off valve 1 only works durably and reliably in the described way when the valve lifter 12 respectively assumes a defined vertical attitude with respect to the valve ball 8 during the two periodically occurring charge conditions of the piezo-electric actuator 2. Thus, the valve lifter 12 must not impede the seating of the valve ball 8 at the sealing seat 13 when the piezo-electric actuator 2 is discharged. The lifter 12 must lift the valve ball 8 to such an extent during the shut-off (piezo-electric actuator 2 is charged) that the fuel can flow off with the desired flow rate and the injection pressure prevailing in the spring chamber can dismantle correspondingly fast. Since the operating temperature of the motor and, thus, the temperature of the shut-off valve 1 is subject to substantial fluctuations amounting up to $\Delta T \approx 200°$ C., it must be assured that the temperature-condition length changes of the mechanical components (actuator 2, housing 4, etc.) lying in the range of the maximum actuator stroke under these conditions do not influence the position of the valve lifter 12.

Figure 2:
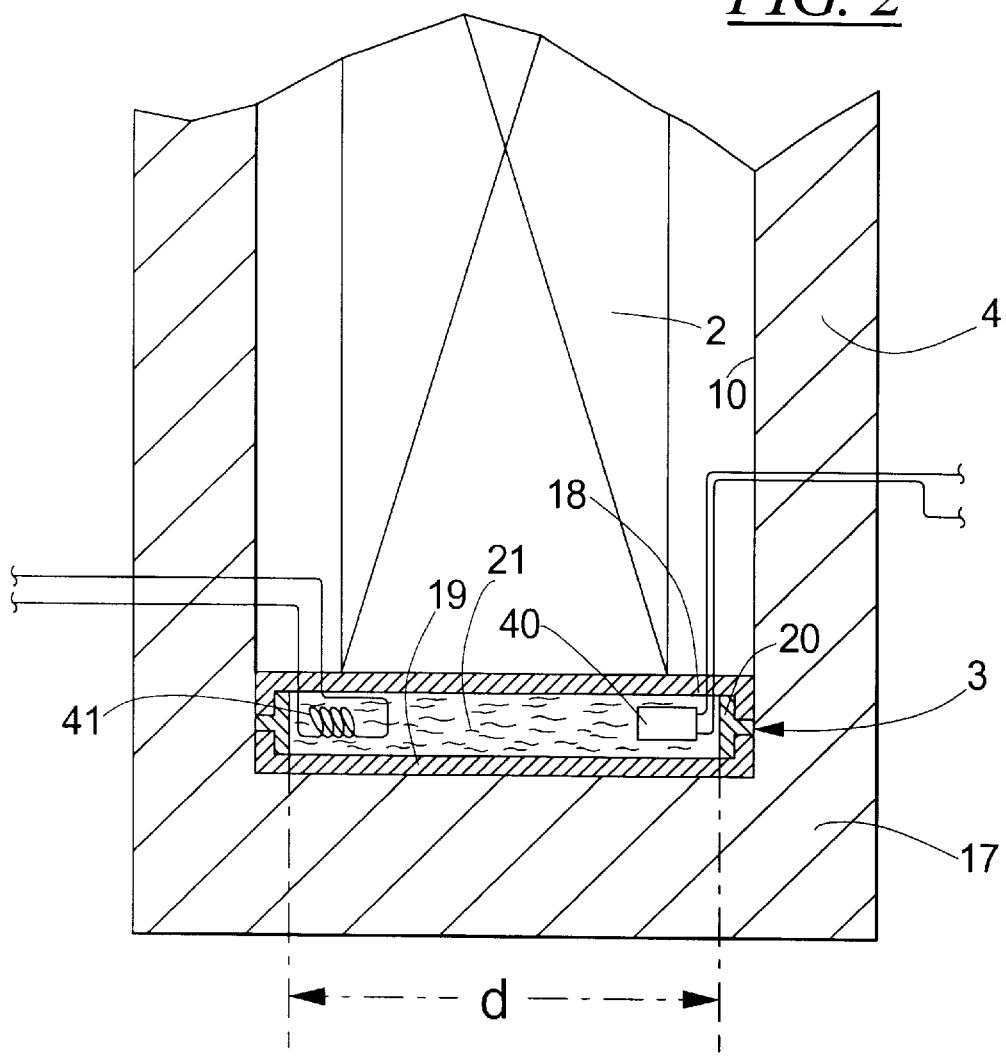
FIG. 2 is an enlarged view of the compensation element supported at the housing floor of the valve.
Figure 3:
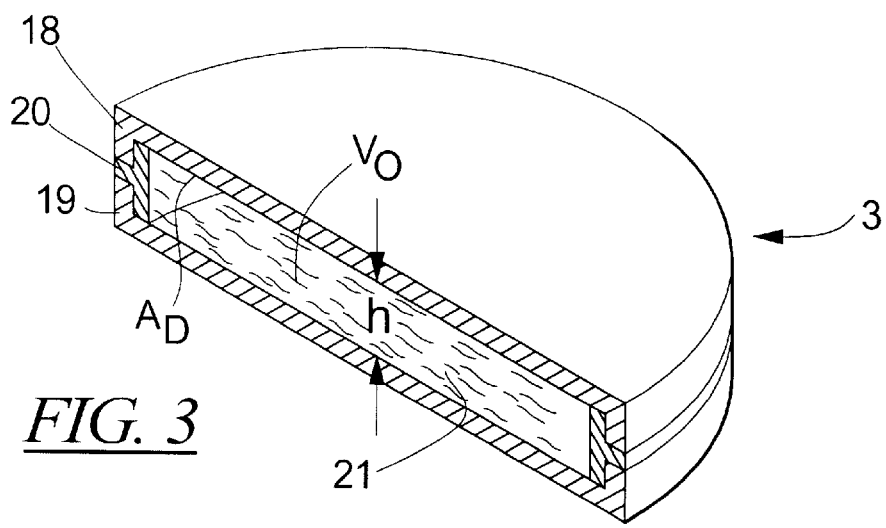
FIG. 3 is a partially perspective illustration of the compensation element.

In the shut-off valve 1 modified according to the present invention, the piezo-electric actuator 2 is not supported at the housing floor 17 but at the compensation element 3 that compensates for temperature-conditioned length change. The compensation element 3 shown magnified in FIGS. 2 and 3 is fit into the cylindrical housing bore 10 with extremely little lateral play (less than 3 μm) and is arranged on the floor 17 of the valve housing 4 serving as a bearing. In the exemplary embodiment, it is composed of two respectively pot-shaped parts 18/19 (V2A Steel, Invar) as well as of a ring element 20 that connects the two parts 18/19 and yields in a vertical direction. The ring element 20 sealing the chamber 21 preferably filled with high-grade hydraulic oil hermetically sealed at the edge side can be fabricated, for example, of nitril butadiene (trade name: Viton).

The piezo-electric actuator 2 is mechanically pre-stressed using the saucer spring 7, and the compensation element 3 is thereby subjected to the static pressure $p_0 = F_{vor}/A_D$ ($F_{vor}$: mechanical pre-stress force of the piezo-electric actuator 2; $A_D = \pi/4 \cdot d^2$: pressure-active end face of the compensation element 3). Given a pre-stress force $F_{vor} = 800N$ of the saucer spring 7 and an end face having a size of $AD = 78.3 \cdot 10^{-6}$ m² (d=10 nm), this amounts to $p_0 = 100$ bar. Such a high static pressure prevents hydraulic plate and assures that no gas bubbles deteriorating the stiffness arise in the oil-filled chamber 21 even at low temperatures.

Like other fluids, oil also has a relatively high thermal coefficient of volume expansion of, typically, $\gamma_{oil} \approx 10^{-3}$ (1/K). When the thermal expansion of the oil is now prevented in two of three spatial directions, every volumetric expansion of the oil is completely converted into a linear expansion, whereby the linear thermal coefficient of length expansion $\alpha_{oil}$ then numerically corresponds to the thermal coefficient of volume expansion ($\alpha_{oil} \approx \gamma_{oil} \approx 10^{-3}$ K$^{-1}$). The present invention uses this effect in order to compensate for temperature-conditioned length changes in the shut-off valve 1 using the oil-filled compensation element 3. Thus, the exactly fitting arrangement of the compensation element 3 in the housing bore 10 and the bearing thereof on the floor 17 of the valve housing 4 assures that every change in the oil or, respectively chamber volume results in a displacement $\Delta h = A_D^{-1} \cdot \Delta V$ of the pot-shaped upper part 18 in a vertical direction that is proportional to the respective volume change $\Delta V$. The problem to be solved is then also that the height h of the oil-filled chamber 21 is to be dimensioned such that the unit composed of the piezo-electric actuator 2 and of the compensation element 3 and the part of the valve housing 4 accepting this unit always have exactly the same length regardless of the temperature T. Leaving the length change of the piston 11 and of the valve lifter 12 out of consideration, the following must thus at least approximately apply:

$$l_P(1+\alpha_P \cdot \Delta T) + h(1+\alpha_{oil} \cdot \Delta T) = l_G(1+\alpha_G \cdot \Delta T) \tag{1}$$

$l_P$: Length of the piezo-electric actuator 2

$\alpha_P$: Linear thermal coefficient of length expansion of the piezo-ceramic h: Height of the chamber 21 of the compensation element 3

$\alpha_{oil}$: Linear thermal coefficient of length expansion of the oil $l_G$: Length of the valve housing 4 effective for the compensation $\alpha_G$: Linear thermal coefficient of length expansion of the housing material $\Delta T$: Change of the temperature T Taking the condition $l_G := l_P + h$, Equation (1) can be rewritten as $$h = \frac{l_P(\alpha_G - \alpha_P)}{(\alpha_{oil} - \alpha_G)} \tag{2}$$

Based on measurements, the thermal coefficient of length expansion of a polarized piezo-ceramic typically amounts to $\alpha_P = -3 \cdot 10^{-6}$ (1/K). With $l_P = 30$ mm, $\alpha_{oil} = 1 \cdot 10^{-3}$ (1/K) and $\alpha_G = 16 \cdot 10^{-6}$ (1/K) (valve housing 4 manufactured of V2A Steel), the required chamber height h is calculated as $$h = 0.58 \text{ mm!} \tag{3}$$

A fluid column having the volume $V_0 = A_D \cdot h$ (h: height of the fluid column) compressed in a rigid cylinder by a piston having the area $A_D$, has a linear spring stiffness c that is dependent on the compression modulus K of the fluid according to the relationship $$c = \frac{A^2_D}{K \cdot V_0} = \frac{A_D}{K \cdot h} \tag{4}$$

In the inventive compensation element 3, a cylindrical oil column having the height h=0.58 mm is compressed using the actuator-side part 21 comprising a pressure-active area $A_D = 78.53 \cdot 10^{-6}$ m², so that $$C_{oil} = \frac{A_p}{K_{oil} \cdot h} = 270 \text{ [N/}\mu\text{m]} \qquad (5)$$

follows from Equation (4) taking the compression modulus $K_{oil}=5 \cdot 10^{-10}$ (m²/N) typical of oil into consideration. This value of the spring stiffness approximately corresponds to 4.5 times the stiffness of the piezo-electric sintered body (7·7·39 mm³) of $c_{Piezo} \approx 60$ N/μm).

Figure 4A:
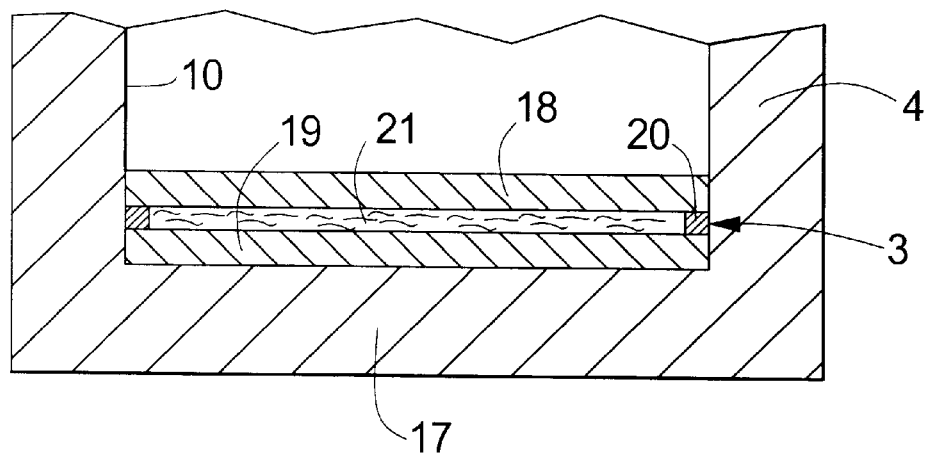
FIGS. 4a, 4b, 4c, 5a, 5b and 6 depict further exemplary embodiments of compensation elements.
Figure 4B:
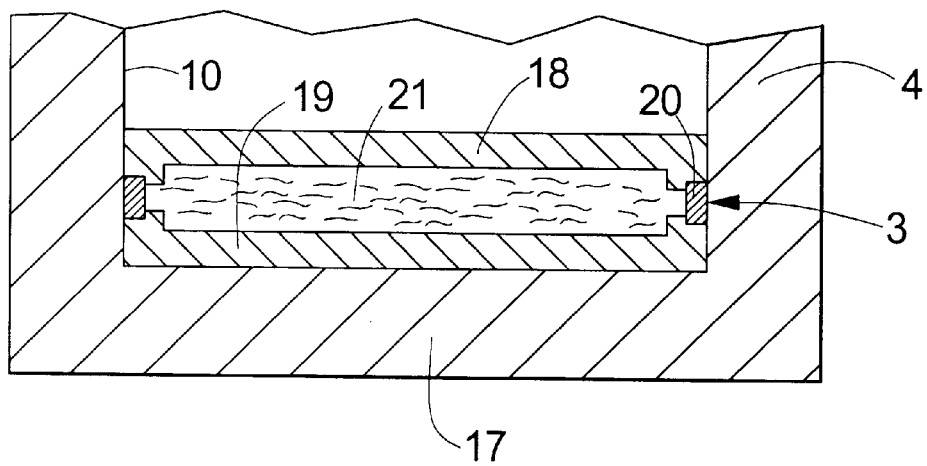

The compensation elements 3 shown in cross-section in FIGS. 4a and 4b are respectively arranged on the floor 17 of a valve housing 4 or on a stiff bearing and are fitted into the cylindrical housing bore 10 with extremely little lateral play. They are respectively composed of an actuator-side, upper part 18, of a bearing-side, lower part 19 and of an element 20 that seals the oil-filled chamber 21 and yields in the vertical direction. In particular, an elastomer (FIG. 4a) vulcanized to the two parts 18/19 or an O-ring come into consideration as seal element 20. Given employment of an O-ring, this can be arranged (not shown) between the parts 18/19 of the compensation element 3 (FIG. 4b) composed of V2A Steel or can be arranged in a channel of the piston-shaped upper part 18. In the latter instance, the lower part is preferably fashioned as a flat disk or thin diaphragm.

Figure 4C:
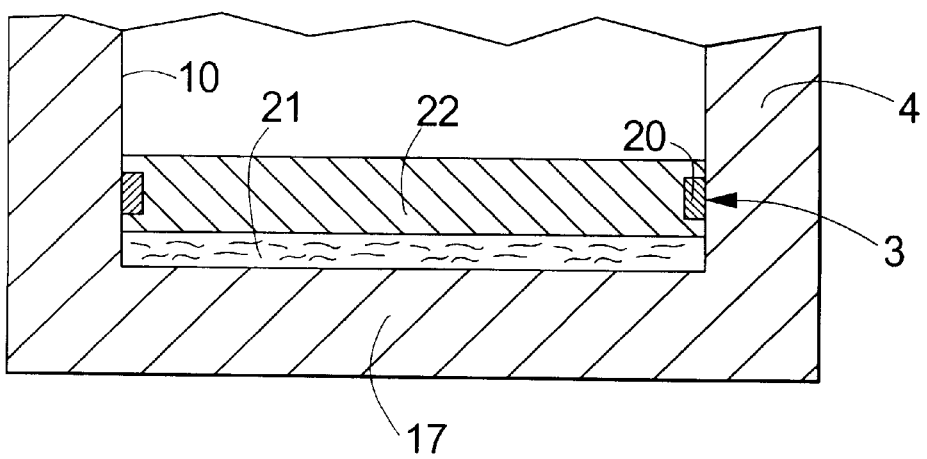

An especially simply construction compensation element 3 is shown in FIG. 4c. It is composed merely of an O-ring-sealed piston 22 that is displaceably guided in the housing bore 10. The housing wall 4 acts as holder that prevents lateral evasion. The housing floor 17 forms the non-displaceable lower part of the compensation element 3 relative to the actuator 2. The oil-filled chamber 21 is located between piston 22 and the housing floor 17.

Figure 5A:
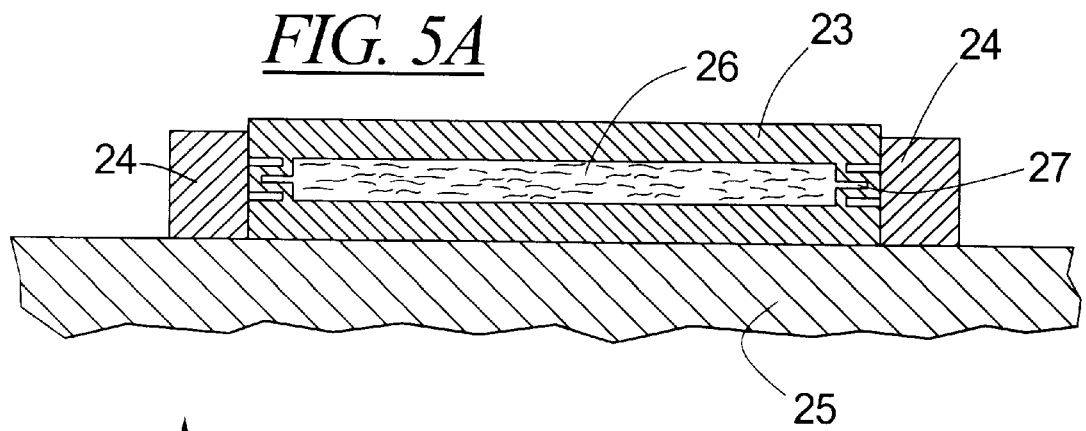
Figure 5B:
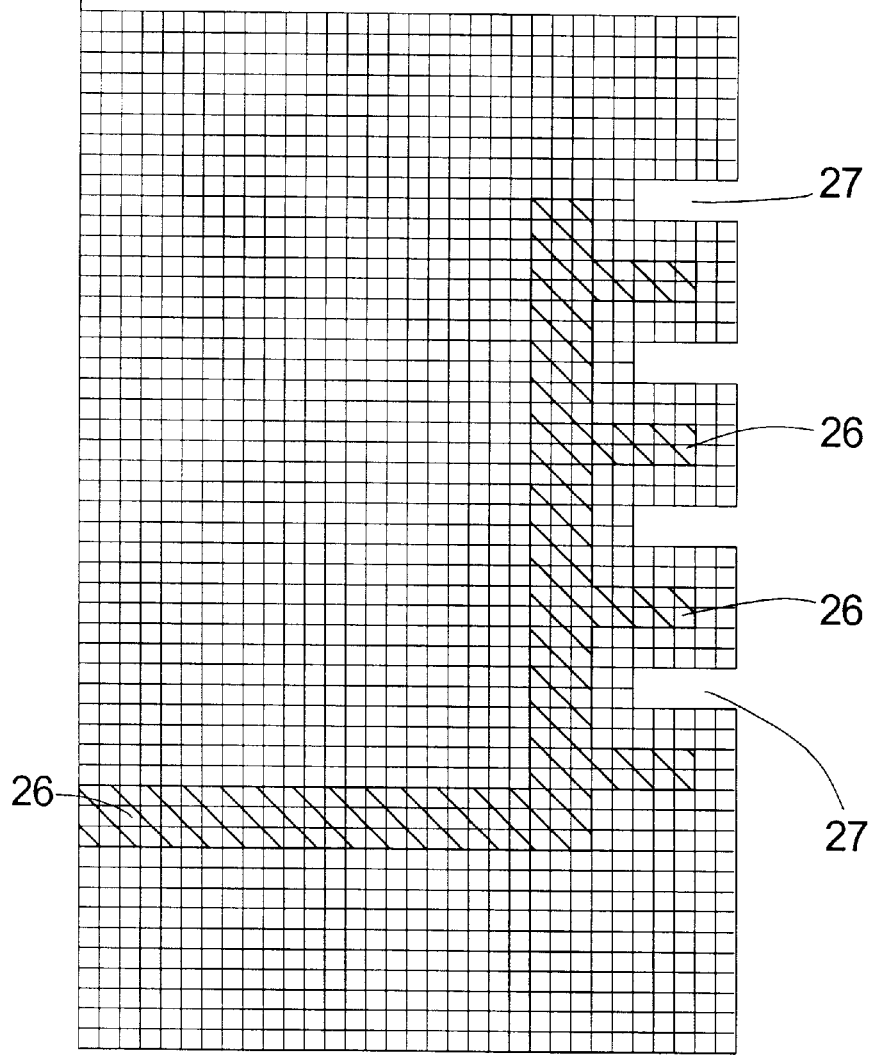

The housing 23 (composed of V2A steel) of the compensation element shown in FIG. 5a is arranged exactly fitted in a metal ring 24 or metal frame serving as holder that is rigidly connected to the seat 25. The slots, channels or milled portions 27 present in the holder-side chamber wall in the region of the oil-filled volume 26 enable the expansion or, respectively the dilation of the housing 23 in the vertical direction. As FIG. 5b shows, the holder-side chamber wall of the compensation element that is rotational-symmetrical with respect to the axis 28 preferably exhibits a meander-shaped or bellows-like structure in cross-section.

Figure 6:
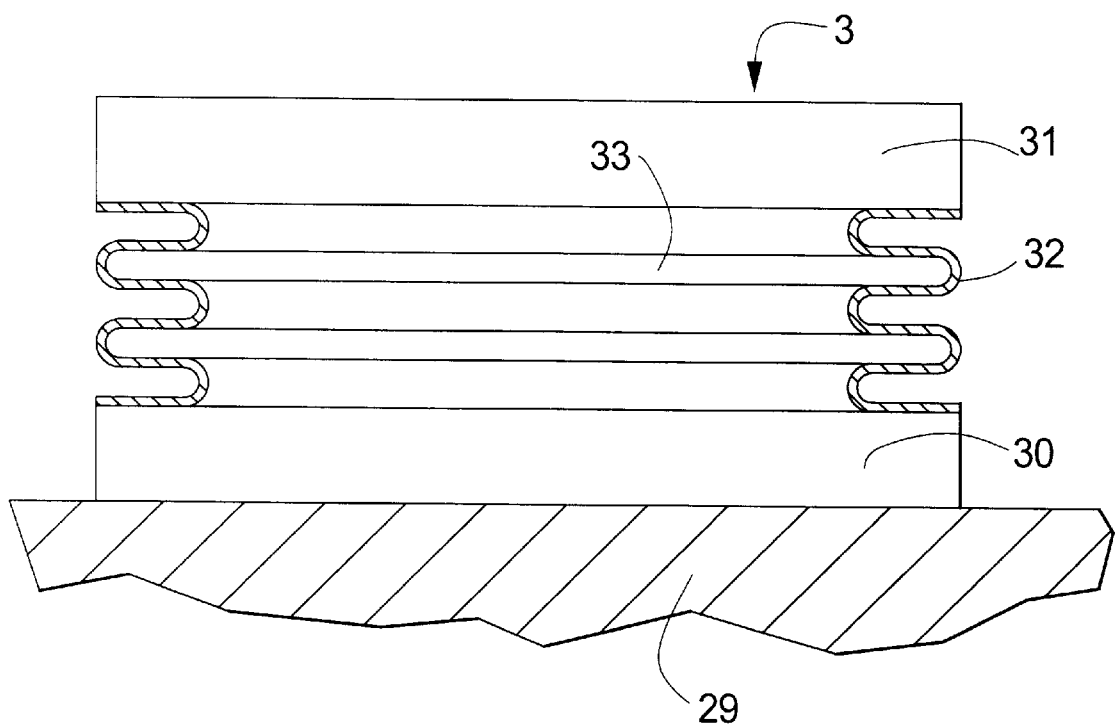

FIG. 6 shows a compensation element 3 arranged free-standing on a bearing 29 (for example, the floor of a valve housing). It is composed of a metal disk 30 (stainless steel) directly supported at the bearing 29, of a metal disk 31 (stainless steel) at the drive side and of a metal bellows 32 welded to the two metal disks 30/31 that is mechanically rigid in lateral direction. The volume enclosed by the metal disks 30/31 and the corrugated metal bellows 32 thereby forms the compensation chamber 33 that is pressure-filled bubble-free with an oil under vacuum and is sealed by laser welding. In particular, stainless steel, bronze or a nickel alloy (Hastelloy, Monel), into consideration as bellows material.

Witzenmann GmbH, Metallschlausch-Fabrik-Pforzheim, D-75175 Pforzheim manufactures corresponding metal bellows (smallest inside diameter $d_i \geq 2$ mm; wall thickness $d_w \geq 0.02$ mm). Since the lateral mechanical stiffness of the metal bellows 32 potentially implemented multi-wall as well exceeds the axial mechanical stiffness by a factor $10^2-10^3$ ($c_{axial} \leq 1-10$ N/mm; $c_{lateral} \geq 10^2-10^3$ N/mm), holder that prevents lateral expansions of the housing is required for such a compensation element 3.

The present invention, of course, is not limited to the above-described exemplary embodiments. The chamber 21 of the compensation element 3 can also be filled with some other fluid instead of oil (mercury, liquid hydrocarbon compound, water), with a grease as well as with a member composed of a plastically deformable material (rubber, plastic). The chamber can be filled with a fluid residing under over-pressure. A sensor 40 can be arranged in the chamber 21 in order to acquire the respectively prevailing chamber pressure (the inside pressure is a direct measure of the force acting on the bearing). The chamber pressure can be set to a defined value by active heating of the medium with a heating element 41 (control of the position of the valve lifter, i.e. active compensation of temperature-conditioned length change). The base area or, respectively, the cross-section of the compensation element 3 can have a quadratically or rectangularly configuration. The compensation element 3 can be arranged on a bearing (disk with a holder encompassing the compensation element) provided with a thread and screw the bearing to the housing accepting the object. The holder 4/24 can be eliminated insofar as the lateral mechanical stiffness of the unfilled compensation element 3 is adequately great ($c_{lateral}/C_{axial} \geq 100-1000$). The compensation element can be utilized not only in injection, control and dosing valves but anywhere that temperature-conditioned length change of an object requires compensation.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A device having a housing having a housing chamber with a first support surface, a drive object disposed in the chamber and having an actuator extending out of the chamber opposite to the first support surface, the improvement being a compensation element disposed in the chamber between an end of the drive object and the first surface, said compensation element having a hermetically tightly sealed chamber filled with an expandable material and having means restricting lateral expansion so that all expansion occurs in an axial direction to compensate for differences in thermal expansion between the housing and the drive object.

2. A device according to claim 1, wherein the means restricting lateral expansion comprises a wall of the housing chamber engaging a peripheral edge of the compensation element.

3. A device according to claim 1, wherein the means for restricting lateral expansion includes a ring-shaped holder surrounding a periphery of the compensation element.

4. A device according to claim 1, wherein the compensation element comprises a pair of members interconnected by a ring of elastically deformable material.

5. A compensation element for compensating a temperature condition length change of a drive object relative to a housing having a housing chamber in which the drive object is disposed, said chamber having a support surface at one end, said compensation element being positioned in series between the drive object and the support surface and comprising an expandable chamber hermetically sealing an expandable medium therein, a lateral mechanical spring rate $C_{lateral}$ and an axial mechanical spring rate $C_{axial}$ of the compensation element meet the condition $C_{lateral}/C_{axial} \geq 10^2$ to $10^3$ given a non-filled expandable chamber, said compensation element having a lateral mechanical stiffness greater than the axial stiffness so that all volume changes of the medium occur in the axial direction and the lateral dimensions of the expandable chamber remaining constant.

6. A compensation element for compensating a temperature condition length change of a drive object relative to a housing having a housing chamber in which the drive object is disposed, said chamber having a support surface at one end, said compensation element being positioned in series between the drive object and the support surface and comprising an expandable chamber hermetically sealing an expandable medium therein, said compensation element having first and second parts forming the expandable chamber, said first part being supported on the support surface and the second part being guided displaceable in a direction of the longitudinal axis of the drive object, said compensation element having a lateral mechanical stiffness greater than the axial stiffness so that all volume changes of the medium occur in the axial direction and the lateral dimensions of the expandable chamber remaining constant.

7. A compensation element according to claim 6, wherein the element is fitted into a bore of the housing accepting the drive object, which bore constrains lateral expansion of said compensation element.

8. A compensation element according to claim 6, wherein at least one of the first and second parts has a recess and wherein the respective other part of the first and second parts covers the recess.

9. A compensation element according to claim 6, wherein the first and second parts are interconnected by an intermediate elastic deformable part.

10. A compensation element according to claim 6, wherein a seal element is disposed between the first and second parts and enables movement in an axial direction therebetween.

11. A compensation element according to claim 6, wherein the compensation element is provided with milled portions on an annular surface to form a bellows structure.

12. A compensation element according to claim 6, which includes a pressure sensor in the expandable chamber of the element.

13. A compensation element according to claim 6, which includes a heating element disposed in the expandable chamber of the compensation element.

14. A compensation element according to claim 6, wherein the element includes a bellows connecting the first and second parts, said bellows being mechanically stiff in the lateral direction.

15. A compensation element according to claim 14, wherein the bellows is a metal bellows.

16. A compensation element according to claim 6, wherein the drive object is an electromechanical transducer.

17. A compensation element according to claim 6, wherein the housing has an axial thermal expansion for a given temperature greater than the axial thermal expansion of the drive object and the thermal expansion of the drive object plus the compensation element equals the thermal expansion of the housing.

* * * * *